United States Patent [19]

Chomiki

[11] Patent Number: 4,491,931
[45] Date of Patent: Jan. 1, 1985

[54] ELASTIC WAVE PROCESSING SYSTEM INVARIANT WITH THE TEMPERATURE

[75] Inventor: Michel Chomiki, Paris, France

[73] Assignee: Thomson-CSF, Paris, France

[21] Appl. No.: 363,383

[22] Filed: Mar. 29, 1982

[30] Foreign Application Priority Data

Apr. 8, 1981 [FR] France ................................ 81 07034

[51] Int. Cl.³ .......................... G06J 1/00; H03H 9/14
[52] U.S. Cl. .................................... 364/861; 310/315;
331/107 A; 333/155
[58] Field of Search ................ 364/821, 861; 333/152,
333/155; 331/107 A

[56] References Cited
U.S. PATENT DOCUMENTS

| 3,875,517 | 4/1975 | Dilley .............................. 333/155 X |
| 3,894,286 | 7/1975 | Armstrong ....................... 333/155 X |
| 4,245,201 | 1/1981 | Takahashi et al. ............. 333/155 X |
| 4,354,166 | 10/1982 | Grudkowski .................... 333/152 X |

FOREIGN PATENT DOCUMENTS 2714159 10/1977 Fed. Rep. of Germany ...... 333/155

*Primary Examiner*—Felix D. Gruber
*Attorney, Agent, or Firm*—Cushman, Darby & Cushman

[57] ABSTRACT

Signal processing by means of a system comprising an elastic wave device, invariant with the temperature.

The input signal $S_e$ is written into a memory at the timing of a fixed clock $h_E$ and read at the timing of a clock $H_L$ supplied by a slaved generator, which also supplies the signals particularly for modulation to an interface circuit. The signal is applied to an elastic wave device which supplies a processed signal $S_3$ applied to a second interface circuit and to a second memory. The slaved generator also supplies the demodulation signals to the second interface circuit and the writing clock signals $H_E$ of the second memory, which is read at the fixed clock timing $h_L$. The slaved generator comprises a basic driver formed by a surface elastic wave oscillator constructed with the same substrate as that of the elastic wave processing device.

18 Claims, 10 Drawing Figures

ELASTIC WAVE PROCESSING SYSTEM INVARIANT WITH THE TEMPERATURE

BACKGROUND OF THE INVENTION

The present invention relates to the construction of systems for processing signals by means of elastic waves invariant with the temperature.

Elastic wave devices are used for numerous applications such for example as: for dispersive delay lines; for pulse compression; for filters; for spectrum analysers using several "$\pi$" or "T" structured dispersive lines and for correlators or convolvers.

For these applications, it is important that any frequency determined by reference to the elastic wave processing device is stable and, more especially, as dependent as little as possible on the temperature. In the opposite case, there is distortion of the output signal with respect to the expected output signal, which is all the greater the larger the temperature variations. This is the case when the equipment using elastic wave processing devices is subjected to large temperature variations, this is the case for example in the field of radar or sonar applications where the equipment is vehicle-borne.

So as to limit the effects due to temperature variations on the elastic wave components, it is known to use substrates and cuts for which the linear variations and the speed variations cancel out in the first order such as, for example, quartz cut according to an "ST" cut. However, these substrates present low coupling coefficients and substrates are generally used whose coupling coefficients are high such as Lithium Niobate ($LiNbO_3$), Bismuth and Germanium Oxide ($Bi_{12}GeO_2$) or Lithium Tantalate ($LiTaO_3$). For these substrates, it is known to overcome the effects due to temperature variations by placing the device in a thermostatic enclosure for regulating the temperature of the substrate. However, these enclosures are consumers of energy and have a thermal inertia when brought into operation. This is a disadvantage for unforeseeable uses of short duration for which the temperature will not be stabilized.

To remedy these disadvantages, the signal processing system of the invention provides great operational stability over a wide temperature range, without a thermostatic enclosure by using clocks, slaved to the temperature, which control the different elements of the signal processing, allowing more especially contraction or expansion of the time of the signal, by means of two write and read memories.

SUMMARY OF THE INVENTION

Briefly it is a signal processing systems having performances independent of the temperature using an elastic wave device comprising at least one propagation substrate, wherein a signal to be processed $S_e$ is written into a memory called "input memory", at the timing of a fixed clock signal $h_E$ and this memory is read at the timing of a clock signal $H_L$ supplied by a generator, slaved to the temperature T of the substrate(s) of the elastic wave device and the frequency $F_L$ of the clock signal $H_L$ varies with the temperature T in accordance with the law $(1/F_L)(\delta F_L/\delta T)=K$, where K is a constant dependent on the material forming the substrate(s) and the cut thereof.

BRIEF DESCRIPTION OF THE DRAWINGS

Other characteristics and advantages will be clear from the following description, illustrated by drawings which represent.

DESCRIPTION OF THE PREFERRED EMBODIMENT

An elastic wave device comprises generally a crystalline piezo-electric substrate, on the surface of which electromechanicl transducer elements ensure the inputting and the outputting of the electrical signals.

For example, the transducers are formed from interdigited metal combs and the elastic waves of the Rayleigh type are surface generated.

Figure 1:
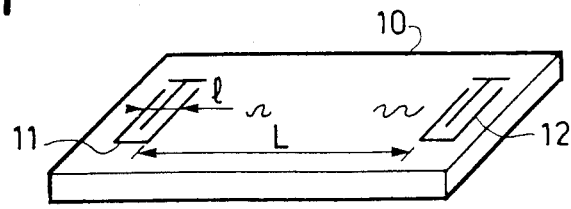
FIG. 1, a surface wave device.

Such a device is shown in FIG. 1. In this figure there is shown a substrate 10 on which are deposited two transducers with interdigited fingers 11 and 12 spaced apart by the length L. A variation of the temperature results, on the one hand, in a modification of the dimensions l and L and by a modification of the speed V of the elastic waves, where l is the distance between two adjacent fingers of transducer.

It is known that this distance between two adjacent fingers l is chosen equal to the wave length or to a multiple of the elastic wave length and thus fixes the frequency of use of the device. Thus, with V the speed of propagation of the waves, the frequency of use may, in particular, be taken equal to $F=(V/l)$ (1). For the distance L travelled over by a wave at frequency F between the two input and output transducers, the delay of the wave between the input and the output is equal to $\tau=(L/V)$ (2).

The variation of the temperature results in two effects, by a modification of the dimensions and so of L and by a modification of the elastic constants, which causes a variation of the propagation speed V.

If T is the temperature, two constant coefficients are defined for a given substrate and cut, characterizing the effect of the temperature:

the coefficient relative to the speed: $(1/V)(\delta V/\delta T)$, the coefficient relative to the dimensions:

$$(1/l)(\delta l/l\ T)=(1/L)(\delta L/\delta T) \qquad (3).$$

These two coefficients allow the variations of the speed and of the delay time to be defined in the first order, which is generally sufficient.

By differentiation of (1) and (2), we get:

$$\frac{1}{F} \frac{\partial F}{\partial T} = \frac{1}{V} \frac{\partial V}{\partial T} - \frac{1}{l} \frac{\partial l}{\partial T} \quad (4)$$

and $$\frac{1}{\tau} \frac{\partial \tau}{\partial T} = \frac{1}{L} \frac{\partial L}{\partial T} - \frac{1}{V} \frac{\partial V}{\partial T} \quad (5)$$

From these relationships (3), (4) and (5) we find:

$$(1/F)(\delta F/\delta T) = -(1/\tau)(\delta \tau/\delta T) = K$$

where K is a constant for the substrate.

Thus for a pattern placed on the surface of the crystalline substrate, the natural frequency of this pattern and the input-output delay relative to this pattern vary relatively by the same amount, but in opposite directions. These variations cause mismatching of the elastic wave device with respect to the input signal, which affects its response.

Figure 2:
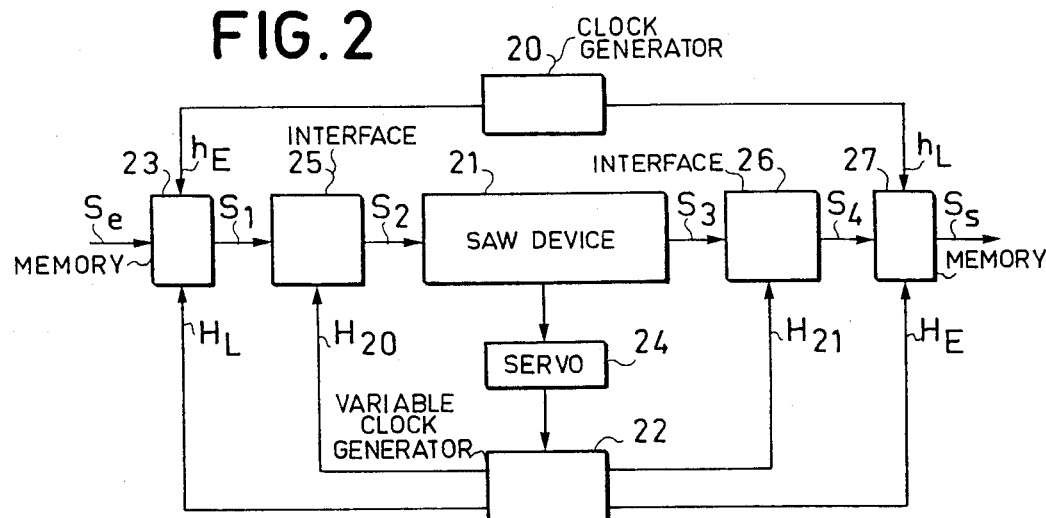
FIG. 2, the general diagram of signal processing by means of an elastic wave device in accordance with the invention.

FIG. 2 shows a general block diagram of the processing system of the invention.

This processing system comprises two clock signal generators the first one 20 supplying signals such as $h_E$ and $h_L$ of fixed frequency and the second one signals such as $H_L$, $H_{20}$, $H_{21}$ and $H_E$ whose frequency varies with the temperature T of the substrate of the elastic wave device 21. The basic driver of the second generator 22 is slaved to the temperature T of the substrate by a slaving circuit 24.

The slaving circuit 24 receives the value of the temperature of the device, transmitted by a sensor situated on the substrate and not shown, for example a thermistor, and supplies the value of the frequency to the basic driver of generator 22.

Signal $S_e$ to be processed is written in an analog or digital memory 23, called input memory, at the timing of the fixed frequency signals $h_E$. This memory 23 is read at the timing of clock signals $H_L$, whose frequency $F_L$ varies with the temperature T. Signals $S_1$ read out from memory 23 are applied to interface circuits 25, more particularly for modulating with signal $S_1$ a carrier frequency matched to the elastic wave device. The frequencies of the signals such as $H_{20}$ supplied to this interface circuit 25 also come from the second clock generator 22 and vary with the temperature T. The signal $S_2$ supplied by this interface circuit 25 is processed by the elastic wave device 21, supplying a signal $S_3$. Signal $S_3$ is applied to a second interface circuit 26 more especially for demodulating this signal. The local oscillator demodulation signals, $H_{21}$, are also supplied by the second clock generator 22 and also vary with the temperature.

At the output of the second interface circuit 26 there is obtained a signal $S_4$ written into a second analog or digital memory 27, called output memory, at the timing of the clock signals $H_E$ which vary with the temperature T and are supplied by the second clock generator.

Finally, the second memory 27 is read at the timing of the clock signals $h_L$, supplied by the clock generator 20 and whose frequency is independent of the temperature.

The input and output memories 23 and 27 are in fact memorization devices comprising buffer memories so as to store the signal in continuous time. It should be noted that in FIG. 2 there is shown schematically the two write-read clock signals connected directly to each memory, whereas these two signals are in actual fact switched to the clock input of each memory at the time of writing-reading and reading-writing cross-over.

Besides the basic driver, the second generator 22 also comprises circuitry formed from multipliers, or dividers, or frequency changers which allow the reading clock signal to be obtained from the input memory $H_L$, the writing clock signal from the output memory $H_E$ and also other pure frequency signals controlling the interfaces.

It should be noted that interface circuits 25 and 26 are no longer required if signal $S_1$ can be used directly by the processing device 21 and if signal $S_3$ can be written directly into the output memory 27.

In the applications for which the output signal $S_3$ of the processing device 21 is used irrespective of the time scale and of the frequencies, the system does not require units 26 and 27. In fact, it is sufficient in this case for the signal to be correctly processed.

Figure 3:
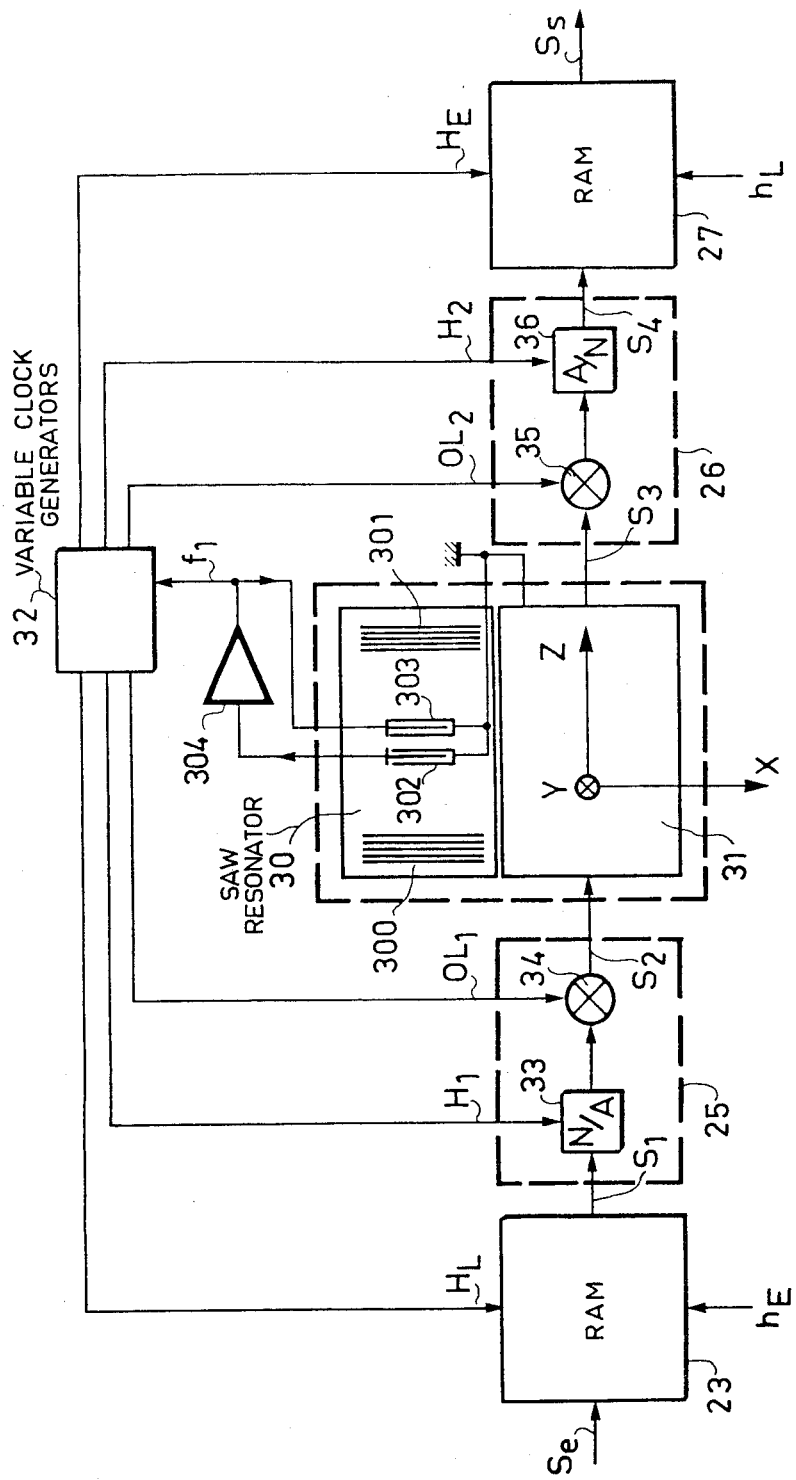
FIG. 3, the diagram for processing the signal by means of an elastic wave device, by slaving the clocks by means of a second elastic wave device.

A simple means for slaving the second generator 22 to the temperature of the substrate of the processing device is to form the basic driver of this generator from an elastic wave oscillator, built with an identical substrate to that of the processing device. In accordance with the invention, the functions of the temperature sensor and of the slaving circuit 24 are ensured by the elastic wave oscillator which then forms by itself the basic driver of the second generator 22, the temperature sensor and the slaving circuit 24. In the rest of the description, the elastic wave oscillator and the circuitry supplying the different frequencies required for the system is called "slaved generator". The preferred embodiment of the invention is shown in FIG. 3.

The signal processing device comprises one or more elastic wave components 31 on a crystalline substrate, for example, made from Lithium Niobate. The crystal is cut in accordance with a known cut, for example cut Y. As shown in this figure, the propagation of the waves follows axis Z, axis Y then being directed downward perpendicularly to the plane of the figure according to the usual conventions.

The elastic wave oscillator is formed by a surface elastic wave resonator 30 whose substrate is formed from the same material, i.e. Lithium Niobate. Two reflecting networks 300 and 301 etched on the surface of the substrate allow a resonating cavity to be obtained. Two transducers 302 and 303, also disposed on the surface, are connected to a high gain amplifier 304, whose output supplies an electric signal of given frequency. The Lithium Niobate forming the substrate of this resonator is cut according to cut Y and the propagation of the elastic waves between the two reflecting networks takes place along axis Z.

Oscillator 30 supplies a frequency $f_1$ whose temperature variation coefficient is:

$$(1/f_1)(\delta f_1/\delta T) = K$$

As is known, oscillator 30,304 can be formed by means of a simple elastic wave delay line whose two input and output transducers are spaced apart by a length depending on the frequency $f_1$ used and are connected to a high gain amplifier.

Circuitry 32 connected to oscillator 30,304 allows the different clock signals required for the system to be formed from frequency $f_1$, either by a phase slaving loop or by division or multiplication or by frequency transposition or by mixing these different techniques. If f is one of these frequencies, the value of this frequency f as a function of the temperature will be such that:

$$(1/f)(\delta f/\delta T)=(1/f_1)(\delta f_1/\delta T)=K$$

Oscillator 30,304 and circuitry 32 form the slaved generator.

The input signal $S_e$ to be processed, coming from a receiving chain, is written into a digital write-read memory 23, of the type called RAM for example, at the timing of the fixed frequency signals $h_E$. The samples of signal $S_1$ written into this memory 23 are read out at the timing of a clock $H_L$ formed in a coherent way from signals at frequency $f_1$ supplied by oscillator 30,304 to circuitry 32.

The output signal $S_1$ of the input memory is read at the period of clock $H_L$ and is converted into an analog signal by converter 33 controlled by a clock signal $H_1$ produced by the slaved generator according to one of the previously mentioned techniques.

The output signal of converter 33 is fed to a frequency changer circuit 34, which modulates a carrier with this frequency, controlled by signal $OL_1$ produced by the slaved generator in accordance with one of the previously mentioned techniques. At the output of the frequency changer 34, signal $S_2$ is at a central frequency allowing it to be processed in the device comprising elastic wave components 31. This frequency is of the order of a few tens of MHz.

The output signal $S_3$ from the processing device 31 is processed symmetrically at the input to the output processing chain 26 resulting in the processed digitalized signal being written into another digital memory 27. The frequency changer circuit 35, the analog-digital converter 36 and the digital memory 27 are respectively controlled by the signal $OL_2$ and clocks $H_2$ and $H_E$ are supplied by the slaved generator in accordance with one of the previously mentioned techniques.

Such a system may thus be considered as being insensitive to the temperature.

Of course, the digital memories may be replaced by analog type memories using, for example, charge coupling devices whose reading or writing clock frequency is supplied by the slaved generator. In this case, converters 33 and 36 are omitted.

The operating principle is to cause the input signal to undergo variations identical to the variations to which the elastic waves on the substrate of the device are subject. The fact of writing and reading in input memory 23 with different clock frequencies $f_e$ and $F_L$ produces on the read-out signal $S_1$ a compression or an expansion of the time scale with respect to the written signal $S_e$.

A time scale is obtained identical at the input and the output of the device by writing signal $S_4$ into the output memory 27 with a clock signal $H_E$ slaved in the same way as the clock signal $H_L$ of the input memory.

Figure 4:
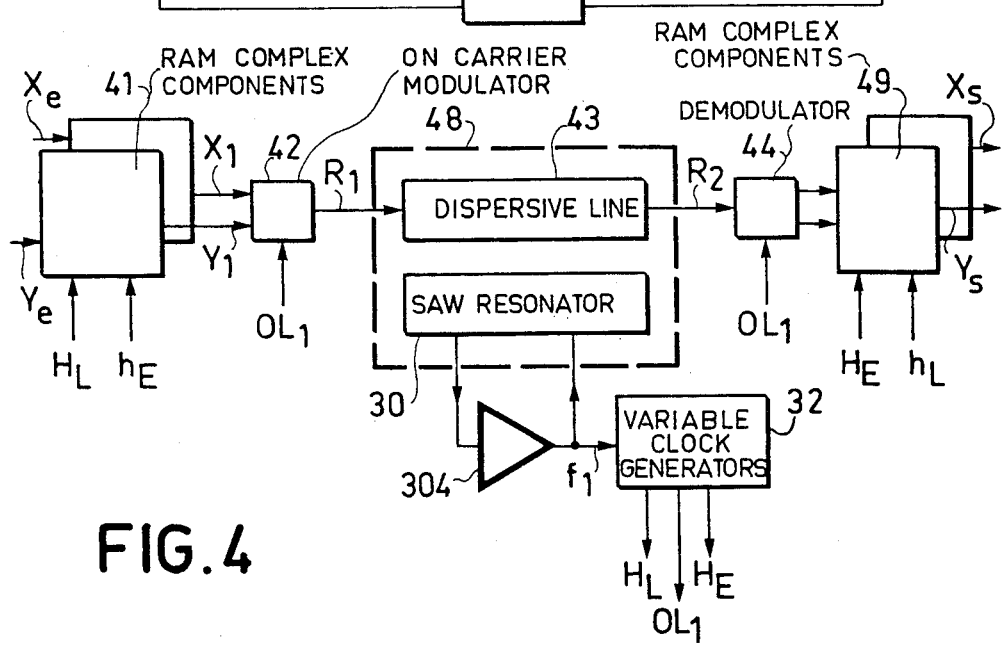
FIG. 4, a pulse compression device invariant with the temperature in accordance with the invention.

FIG. 4 shows the general block diagram of an application relative to pulse compression, with a dispersive elastic wave delay line 43.

The input of the line is connected to an input memory 41, controlled for reading by a clock $H_L$ and to a modulator 42 controlled by the local oscillator $OL_1$. The output of the line is connected to an output memory 49 controlled for writing by a clock $H_E$ and to a demodulator 44 controlled by the local oscillator $OL_1$. According to the invention, the signals $H_L$, $H_E$ and $OL_1$ are supplied by a slaved generator formed from circuitry 32 itself driven by an oscillator comprising an amplifier 304 and a surface wave resonator 30 placed in the same enclosure as line 43, the relative frequency variation $\Delta f_1/f_1$ of this oscillator depending on the temperature of the substrate of this delay line 43.

In an input memory 41 are written, at the timing of the fixed clock $h_E$, the real and imaginary components $X_e$ and $Y_e$ of a signal to be processed.

Figure 5:
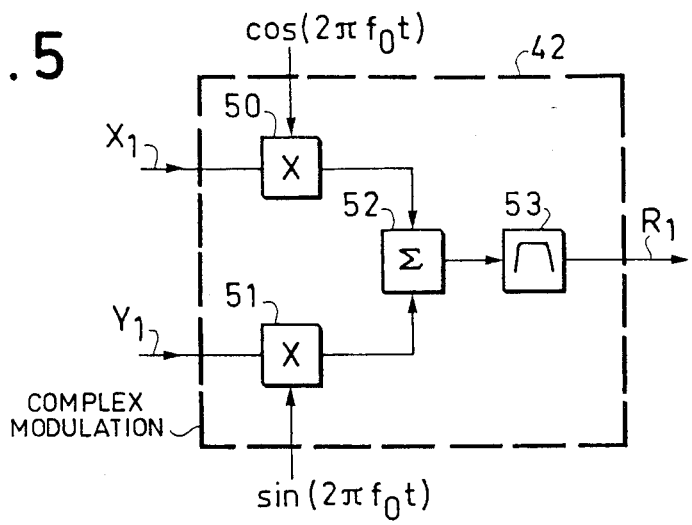
FIG. 5, a diagram for modulating a carrier with a signal given by its complex components.

The two blocks of memory 41 are read at rate $H_L$ supplied by the slaved generator. The output signals $X_1$ and $Y_1$ are applied to a modulator 42 shown in FIG. 5.

The signals $X_1$ and $Y_1$ are multiplied respectively by $\cos(2\pi f_0 t)$ and $\sin(2\pi f_0 t)$ in circuits 50 and 51 and added in circuit 52 and filtered about $f_o$ by filter 53. $f_o$ is the central frequency of operation of dispersive line 43. The signals $OL_1$ at frequency $f_o$ are supplied by the slaved generator.

Figure 6:
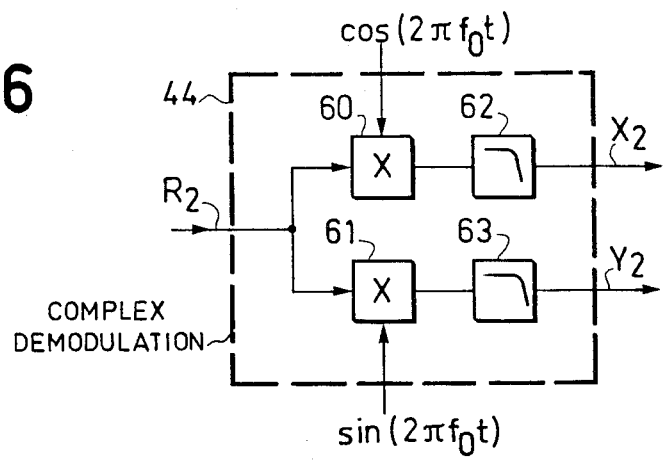
FIG. 6, a complex demodulation diagram.

The signal $R_1$ thus modulated is formed from a linearly frequency modulated pulse of a duration $T_1$ and of band B centered about the transposed frequency $f_o$. The line has a delay law linear with the frequency so that if its slope is the reverse of that of the input signal, a time compressed pulse $R_2$ is obtained at the output. This pulse $R_2$ is then demodulated in circuit 44, shown in FIG. 6. Signal $R_2$ is multiplied in circuits 60 and 61 by $\cos(2\pi f_0 t)$ and $\sin(2\pi f_0 t)$ where the frequency $f_0$ is supplied by the oscillator $OL_1$. The two signals $X_2$ and $Y_2$ obtained are then filtered in two low-pass filters 62 and 63 whose cut-off frequency is greater than B/2. The two components are then stored in memory 49.

If the time scale does not play a role in the use of the output signal, modulator 44 and memory 49 may be omitted.

Figure 7:
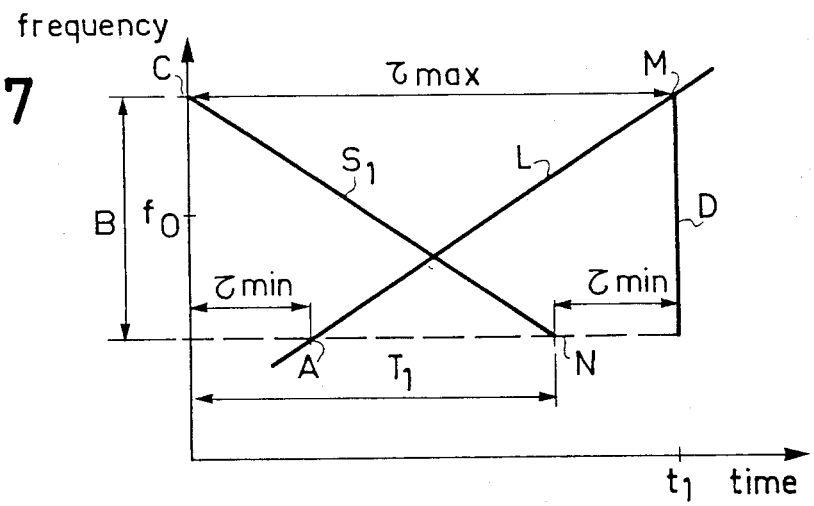
FIGS. 7, 8 and 9, diagrams showing the variation of the pulse compression of a dispersive line depending on the temperature.

In FIG. 7, there is shown a signal $S_1$ of duration $T_1$ and of band B modulated linearly in frequency, in the frequency f-time t plane. The points C and N represent the limits of this signal. In this figure there is also shown the straight line L representing the frequency-delay law of a dispersive line matched to signal $S_1$. The points M and A of L correspond to the maximum and minimum delays $\tau_{max}$ and $\tau_{min}$, with $\tau_{max}=T_1+\tau_{min}$.

At time $t_1=\tau_{max}$ the compressed pulse is obtained shown by the vertical straight line D in the figure. If the temperature T varies from $\Delta T$, the variation law L of the delays $\tau$ as a function of the frequency f varies. This new law $L_1$ is such that f is changed into $f(1+Q)$ and $\tau$ into $\tau(1-Q)$, where $Q=K\Delta T$.

Figure 8:
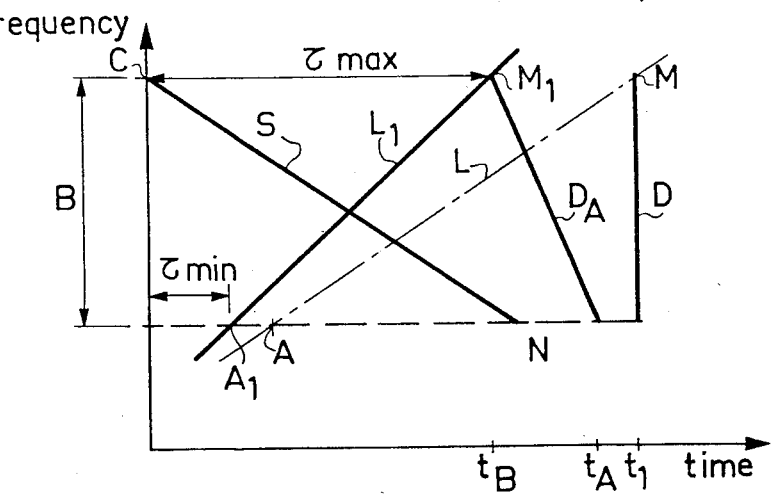

FIG. 8 shows the pulse compression of a signal $S_1$ by the dispersion law $L_1$ corresponding to the temperature $T+\Delta T$. The points M and A of the straight line L are replaced by points $M_1$ and $A_1$ of the straight line $L_1$. This figure shows that the resulting pulse $D_A$ has a duration of $t_A$-$t_B$, the times $t_A$ and $t_B$ being obtained by taking the new values of $\tau_{max}$ and of $\tau_{min}$.

Figure 9:
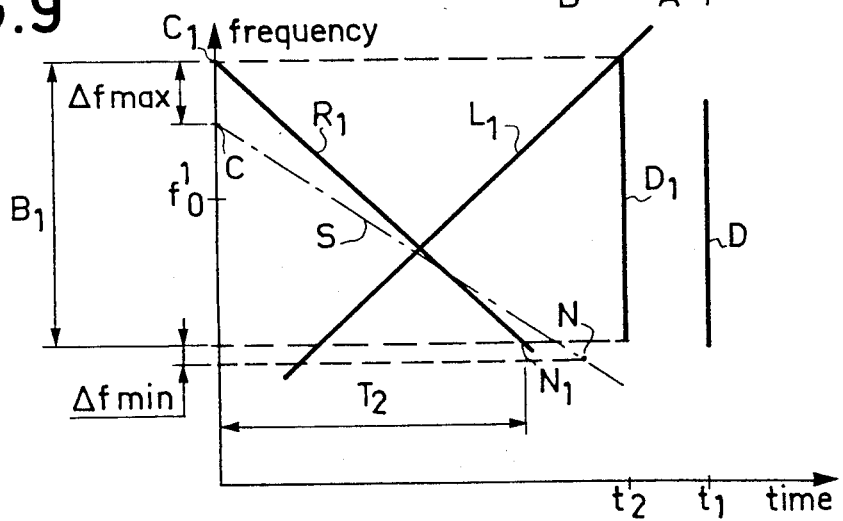

In FIG. 9, there is shown the compressed input signal $R_1$ according to the invention. By reading the signal in the input memory 41 with a clock whose frequency drift $\Delta F_L$ is such that: $\Delta F_L/F=Q$ and by modulating in modulator 42 about a frequency $f_o{}^1=f_o(1+Q)$, the signal $R_1$ is obtained limited at points $C_1$ and $N_1$ at the input of line 43. This signal is matched to the frequency-delay law $L_1$ and at the output a signal $D_1$ is obtained correctly compressed at time $t_2=t_1(1-Q)$ in the band $B_1=(1+Q)B$ and over the duration $T_2=T_1(1-Q)$.

So as to retrieve the compressed signal D with the correct time scale, the output signal is written into memory 49 so that time $t_2$ coincides with time $t_1$ in this new time scale. This result is obtained in accordance with the invention. Also the demodulation frequency of circuit 44 follows the drift Δf/f of the line, so as to demodulate in accordance with the frequency $f_o$.

For some uses, the signal may be used directly at the output of the device, circuit 44 and memory 49 being able to be omitted.

By way of example, in the case of a Lithium Niobate substrate cut according to the Y-Z cut, $K = -(1/\tau)(\delta\tau/\delta T) = 94.10^{-6}/°C$.

For a clock frequency $F_L = 20$ MHz and a temperature variation of 30° C., the frequency variation is equal to about 60 KHz.

It is known to implement the Fourier transform of the signal by using several dispersive delay lines, or dispersive filters, similar to line 43 of the preceding application.

Figure 10:
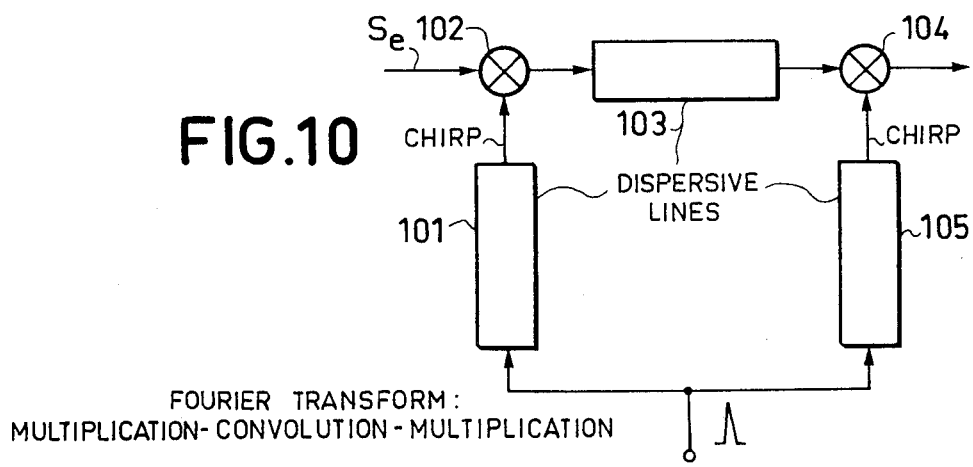
FIG. 10, the diagram of a frequency analyser formed by elastic wave devices.

FIG. 10 shows a construction of a Fourier transformer according to the circuit called M.C.M. (multiplication-convolution-multiplication).

In this circuit, the input signal $S_e$ is multiplied in a multiplying circuit 102 by a signal, called chirp, modulated linearly in frequency of band $B_R$ and of duration $T_R$, about the central frequency $F_R$. This signal is obtained by feeding a very short pulse to the input of a dispersive filter 101. The signal obtained at the output of multiplier 102 is convolved in a dispersiver filter 103 of band $B_c$ and duration $T_c$ about the central frequency $F_c$. The slopes of the two dispersive filters 101 and 103 are equal and of opposite signs so that:

$$a = B_R/T_R = -B_c/T_c$$

The signal at the output of the convolution filter is multiplied in a multiplier 104 by a chirp signal identical to the preceding one, supplied by a dispersive filter 105. The Fourier transform of the input signal is obtained at the output, a frequency being shown by an arrival time.

If $\tau_R$ and $\tau_c$ are the smallest delays in the bands corresponding to the dispersive filters 101 and 103, the arrival time at a given temperature for a frequency $F_o$ is:

$$t_{Fo} = \tau_R + \tau_c + \frac{T_R + T_c}{2} + \frac{1}{a}(F_R - F_c - F_o)$$

At another temperature which differs by $\Delta T$ from the preceding one, the durations and the delays vary by $1-Q$, with $Q = K\Delta T$, whereas the frequencies vary by $1+Q$. The loss $a$ becomes $$a \frac{1+Q}{1-Q}$$

and the arrival time is equal to:

$$t'_{Fo} = (1-Q)\left| \tau_R + \tau_c + \frac{T_R + T_c}{2} + \frac{1}{a}\left(F_R - F_c - \frac{F_o}{1+Q}\right)\right|$$

According to this expression, by varying the input frequencies so that $\Delta F/F = Q$ and by measuring the time at the output with a clock whose temperature variation is such that:

$$T_H/T_H = -Q,$$

the system becomes invariant with the temperature, which is achieved in accordance with the invention.

Thus an invention has been described which is particularly advantageous for systems already working with time lags and comprise memories for storing the input and output signals. A widespread application for which the invention is very advantageous, is that concerning spectrum analysers using elastic wave dispersive filters of the type called "RAC", which is the abbreviation of Reflective-Array Compressor, in which reflecting grooves are etched on the surface of the substrate, the distance separating them being equal to the wavelength which is reflected at this location. The invention also applies to surface elastic wave convolving devices which are used in numerous processing operations, such as filtering matched to processing the signal from a side-looking radar with synthetic antenna.

The choice of a surface elastic wave oscillator formed with a substrate having the same temperature drift as that or those used for the processors used is the preferred embodiment of the invention.

What is claimed is:

1. A signal processing system independent of temperature, comprising:
   a generator for producing a fixed clock signal $h_E$,
   an elastic wave device with at least one propagation substrate,
   an input memory for storing a signal $S_e$ to be processed at the timing of said fixed clock signal $h_E$ and
   a generator for producing a clock signal $H_L$ slaved to the temperature T of the substrate(s) of the elastic wave device for reading said memory, the frequency $F_L$ of the clock signal $H_L$ varying with the temperature T according to the law $(1/F)(\delta F_L/\delta T) = K$, where K is a constant dependent on the material and on the cut of the substrate(s).

2. The processing system as claimed in claim 1, wherein said slaved generator produces a second clock signal $H_E$ and said fixed clock signal generator produces a second fixed clock signal $h_L$ and including a second output memory for storing the output of said elastic wave device at the timing of clock signal $H_E$, said output memory being read at the timing of clock signal $h_L$, the frequency of the clock signal $H_E$, supplied by the slaved generator, varying with the temperature T according to the law: $(1/F_E)(\delta F_L/\delta T) = K$.

3. The processing system as claimed in claims 1 or 2, wherein the slaved generator comprises a basic driver supplying a frequency $f_1$ which varies with the temperature according to the law: $(1/f_1)(\delta f_1/\delta T) = K$.

4. The processing system as claimed in claim 3 including a device for measuring the temperature T and, wherein the slaved generator comprises a slaving circuit supplying signals, for slaving to the temperature T of the substrate(s), to the basic driver and connected to said device for measuring the temperature T.

5. The processing system as claimed in claim 3, wherein the slaved generator comprises circuitry connected to the basic driver supplying frequencies f which vary with the temperature according to the law: $(1/f)(\delta f/\delta T) = K$.

6. The processing system as claimed in claim 4, wherein the basic driver, the slaving circuit and the device for measuring the temperature T are formed by an elastic wave oscillator formed with the same substrate and in accordance with the same cut as the substrate(s) of the elastic wave device.

7. The processing system as claimed in claim 6, wherein the elastic wave oscillator is formed on the same substrate as that of the elastic wave device.

8. The processing system as claimed in claim 6, wherein the elastic wave oscillator is a surface wave resonator looped across a high gain amplifier.

9. The processing system as claimed in claim 6, wherein the elastic wave oscillator is a surface wave delay line looped back across a high gain amplifier.

10. The processing system as claimed in claim 6, further including a first interface circuit receiving a reading signal $S_1$ from the input memory and producing a signal $S_2$ and a frequency changer circuit under the control of a signal $OL_1$ supplied by the slaved generator and wherein signal $S_2$ supplied by the first interface circuit is applied to the elastic wave device.

11. The processing system as claimed in claim 10, wherein the input memory is digital and the first interface circuit comprises a digital-analog converter controlled by a clock signal $H_1$ supplied by the slaved generator.

12. The processing system as claimed in claim 6, further comprising a second interface circuit receiving an output signal $S_3$ from the elastic wave processing device and a demodulation circuit, under the control of a signal $OL_1$ supplied by the slaved generator and wherein a signal $S_4$ supplied by the second interface circuit is applied to the output memory.

13. The processing system as claimed in claim 12, wherein the output memory is digital and the signals supplied by the elastic wave device are applied to an analog-digital converter at the timing of a clock $H_L$ supplied by the slaved generator.

14. The processing system as claimed in claim 10, wherein the processing is a linearly frequency modulated pulse compression and including an elastic wave dispersive line.

15. The processing system as claimed in claim 14, wherein said input memory is a two block memory and the input signal $S_e$ with its two real and imaginary components $X_e$ and $Y_e$ is written into said two block memory at a timing of clock signal $h_E$ and read at the timing of the clock signal $H_L$, and further including a carrier modulating circuit, said input memory supplying two signals $X_1$ and $Y_1$ to said carrier modulating circuit to produce an output $R_1$ applied to the dipersive line to produce a compressed signal $R_2$, the signals $OL_1$ and $H_L$ being supplied by the slaved generator.

16. The processing system as claimed in claim 15, including a demodulating circuit receiving signal $OL_1$ and demodulating the compressed pulse $R_2$, the two real and imaginary components $X_s$ and $Y_s$ being written into said two block output memory at the timing $H_E$ and read at the timing $h_L$, the signals $OL_1$ and $H_E$ being supplied by the slaved generator.

17. The processing system as claimed in claim 12, wherein the output memory is an analog memory formed by a charge coupling device technique.

18. The processing system as claimed in claim 1, wherein the input memory is an analog memory formed by a charge coupling device technique.

* * * * *